United States Patent [19]
Hashiguchi et al.

[11] Patent Number: 5,341,338

[45] Date of Patent: Aug. 23, 1994

[54] DATA OUTPUT CIRCUIT WITH MINIMUM POWER SOURCE NOISE

[75] Inventors: Hiroyuki Hashiguchi; Ituro Iwakiri, both of Miyazaki, Japan

[73] Assignee: Oki Electric Industry Co., Ltd., Tokyo, Japan

[21] Appl. No.: 903,563

[22] Filed: Jun. 24, 1992

[30] Foreign Application Priority Data

Jun. 26, 1991 [JP] Japan .................. 3-154225

[51] Int. Cl.$^5$ .................. H03K 3/01
[52] U.S. Cl. .................. 365/206; 365/189.05; 307/473; 307/443; 307/270
[58] Field of Search .................. 365/149, 205, 206, 203, 365/189.05, 270; 307/443, 473, 451, 270, 571, 579, 576

[56] References Cited

U.S. PATENT DOCUMENTS

| | | | |
|---|---|---|---|
| 4,982,380 | 1/1991 | Koike | 365/189.05 |
| 5,023,472 | 6/1991 | Hashimoto et al. | 307/443 |
| 5,060,196 | 10/1991 | Pae et al. | 365/189.05 |
| 5,097,149 | 3/1992 | Lee | 365/443 |
| 5,148,048 | 9/1992 | Kawasaki et al. | 307/443 |

Primary Examiner—Eugene R. LaRoche
Assistant Examiner—Vu Le
Attorney, Agent, or Firm—Edward D. Manzo

[57] ABSTRACT

A data output circuit suitable for an integrated circuit operable at a high bit rate and having a plurality of bits of outputs. A first output transistor has a conduction path whose one electrode is connected to an output terminal, and a control electrode for controlling the conduction path in response to a first signal. A second output transistor has a conduction path whose one electrode is connected to the output terminal, and a control electrode for controlling the conduction path in response to a second signal complementary to to the first signal. A switch transistor has a conduction path having one electrode connected to the other electrode of the conduction path of the first output transistor and the other electrode connected to a first power source, and a control electrode for rendering the conduction path conductive in response to a switch signal which occurs after the first signal. A capacitor has one electrode connected to the other electrode of the first output transistor and the other electrode connected to a second power source. A plurality of such data output circuits may be mounted on a single integrated circuit, e.g., a semiconductor memory.

11 Claims, 4 Drawing Sheets

DATA OUTPUT CIRCUIT WITH MINIMUM POWER SOURCE NOISE

BACKGROUND OF THE INVENTION

1. Field of the Invention

The present invention relates to a data output circuit and, more particularly, to a data output circuit suitable for a semiconductor memory or similar integrated circuit operable at a high bit rate and having a plurality of bits of outputs.

2. Description of the Prior Art

Generally, an integrated circuit operable at a high bit rate has a data output circuit including, for example, a latch circuit for latching 1-bit data which are complementary to each other. In this type of data output circuit, complementary outputs of the latch circuit are routed through buffers to a pair of output transistors, e.g., n-channel metal oxide semiconductor field effect transistors (MOSFET) connected in series between two reference power sources. Output data appear on the node of such a serial connection. The latch circuit includes two NAND gates connected crosswise. It is a common practice to assign a data output circuit having this configuration to each of a plurality of bits of outputs of an integrated circuit.

In operation, complementary data to be outputted are latched by the latch circuit and fed to the pair of output transistors via the inverters to drive the transistors. As a result, the pair of output transistors are rendered conductive and nonconductive in a complementary fashion, so that a current flows from conductive one of the transistors to a load.

The above-described conventional data output circuit including a serial connection of a pair of output transistors has a noise problem. Specifically, noise is generated in the circuit when, at the final stage of operation, one of the output transistors is turned on and the other transistor is turned off to output one bit of data having a certain logical state, i.e., when a current flows from the load to one reference power source via one output transistor and a current flows from the other reference power source to the load via the other output transistor. This kind of noise is not negligible in among others, an integrated circuit having a great number of parallel bits of outputs since the number of data output circuits increases with the increase in the number of bits. The total noise of this kind is sometimes great enough to cause other circuit elements packed in the same chip to malfunction and is apt to increase the access time.

SUMMARY OF THE INVENTION

It is therefore an object of the present invention to provide a data output circuit capable of outputting data with a minimum of power source noise.

In accordance with the present invention, a data output circuit has an output terminal for outputting data. A first output transistor has a conduction path whose one electrode is connected to the output terminal, and a control electrode for controlling the conduction path in response to a first signal. A second output transistor has a conduction path whose one electrode is connected to the output terminal, and a control electrode for controlling the conduction path in response to a second signal complementary to the first signal. A first switch transistor has a conduction path having one electrode connected to the other electrode of the conduction path of the first output transistor and the other electrode connected to a first power source, and a control electrode for rendering the conduction path of the first switch transistor conductive in response to a first switch signal which occurs after the first signal. A first capacitor has one electrode connected to the other electrode of the conduction path of the first output transistor and the other electrode connected to a second power source.

Also, in accordance with the present invention, an integrated circuit has a plurality of data output circuits each being responsive to data signals complementary to each other for outputting data corresponding to the data signals. The plurality of data output circuits each has an output terminal for outputting data. A first output transistor has a conduction path whose one electrode is connected to the output terminal, and a control electrode for controlling the conduction path in response to a first signal. A second output transistor has a conduction path whose one electrode is connected to the output terminal, and a control electrode for controlling the conduction path in response to a second signal complementary to the first signal. A first switch transistor has a conduction path having one electrode connected to the other electrode of the conduction path of the first output transistor and the other electrode connected to a first power source, and a control electrode for rendering the conduction path of the first switch transistor conductive in response to a first switch signal. A first capacitor has one electrode connected to the other electrode of the conduction path of the first output transistor and the other electrode connected to a second power source. The integrated circuit further has a control circuit for receiving a control signal which occurs after the first signal, delaying the control signal a predetermined period of time to produce the first switch signal, and feeding the first switch signal to the first switch transistor of each of the plurality of data output circuits.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Figure 1:
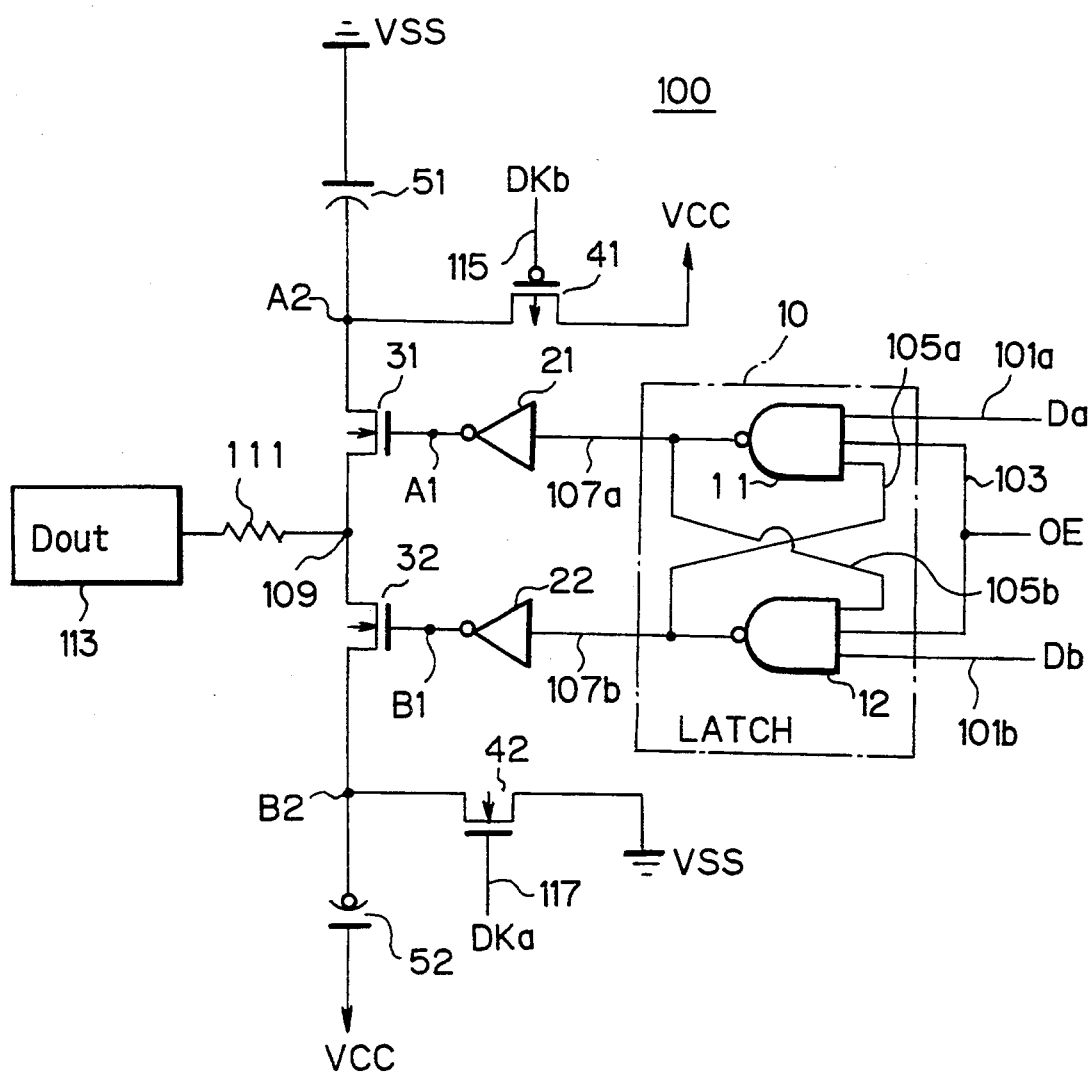
FIG. 1 is a functional block diagram schematically showing a preferred embodiment of the data output circuit in accordance with the present invention.

Referring to FIG. 1 of the drawings, a data output circuit embodying the present invention is shown which is assigned to a 1-bit output of an integrated circuit, e.g. a semiconductor memory. As shown, the data output circuit, generally 100, has a latch circuit 10 assigned to complementary 1-bit data Da and Db which are fed from another circuit also included in the IC. The latch circuit 10 has two tri-input NAND gates 11 and 12. The complementary data Da and Db are respectively applied to one input 101a of the NAND gate 11 and one input 101b of the NAND gate 12. The NAND gates 11 and 12 have inputs 103 thereof commonly connected and receive an output enable signal OE thereat from a control circuit, not shown. Further, the NAND gates 11 and 12 have inputs 105a and 105b, respectively, which are each connected to the output 107b or 108a of the other NAND gate 12 or 11 crosswise. The complementary outputs 107a and 107b of the NAND gates 11 and 12 are respectively connected to inverters, i.e., buffers 21 and 22. A pair of output transistors, e.g., n-channel MOSFETs 31 and 32 respectively have gates A1 and B1 to which the inverters 21 and 22 are respectively connected. The source-drain paths of the output transistors 31 and 32 are connected in series to each other. A node 109 of such a serial connection is connected to an output terminal (Dout) 113 via a load resistor 111, output data appearing on the output terminal 113. If desired, the n-channel MOSFETs implementing the output transistors 31 and 32 may, of course, be replaced with p-channel MOSFETs or even with bipolar transistors. Then, the latch circuit 10 may be constituted by the other transistors or may even be omitted.

The pair of output transistor 31 and 32 are connected between two reference power sources VSS and VCC via capacitors 51 and 52, respectively. In the illustrative embodiment, the reference power sources VSS and VCC are the ground potential and a negative potential, respectively. In the embodiment, the capacitors 51 and 52 are each implemented by a MOSFET. A node A2 between the output transistor 31 and the capacitor 51 is connected to the reference power source Vcc via a switch element 41. In the embodiment, the switch element 41 is constituted by a p-channel MOSFET and has a gate 115 to which a switch signal DKb is fed from a switch control 60 which will be described with reference to FIG. 2 later. Likewise, a node B2 between the other output transistor 32 and the capacitor 52 is connected to the reference power source VSS via a switch element 42. Implemented by an n-channel MOSFET in the embodiment, the switch element 42 has a gate 117 which receives a switch signal DKa from the switch control 60. A data output circuit having such a construction is assigned to each of the bit outputs of the integrated circuit. While the switch elements 41 and 42 are respectively constituted by a p-channel and an n-channel MOSFET in the embodiment, the same channel may be implemented by the other MOSFET or may even be constituted by another type of switching device, e.g., a bipolar transistor.

Figure 2:
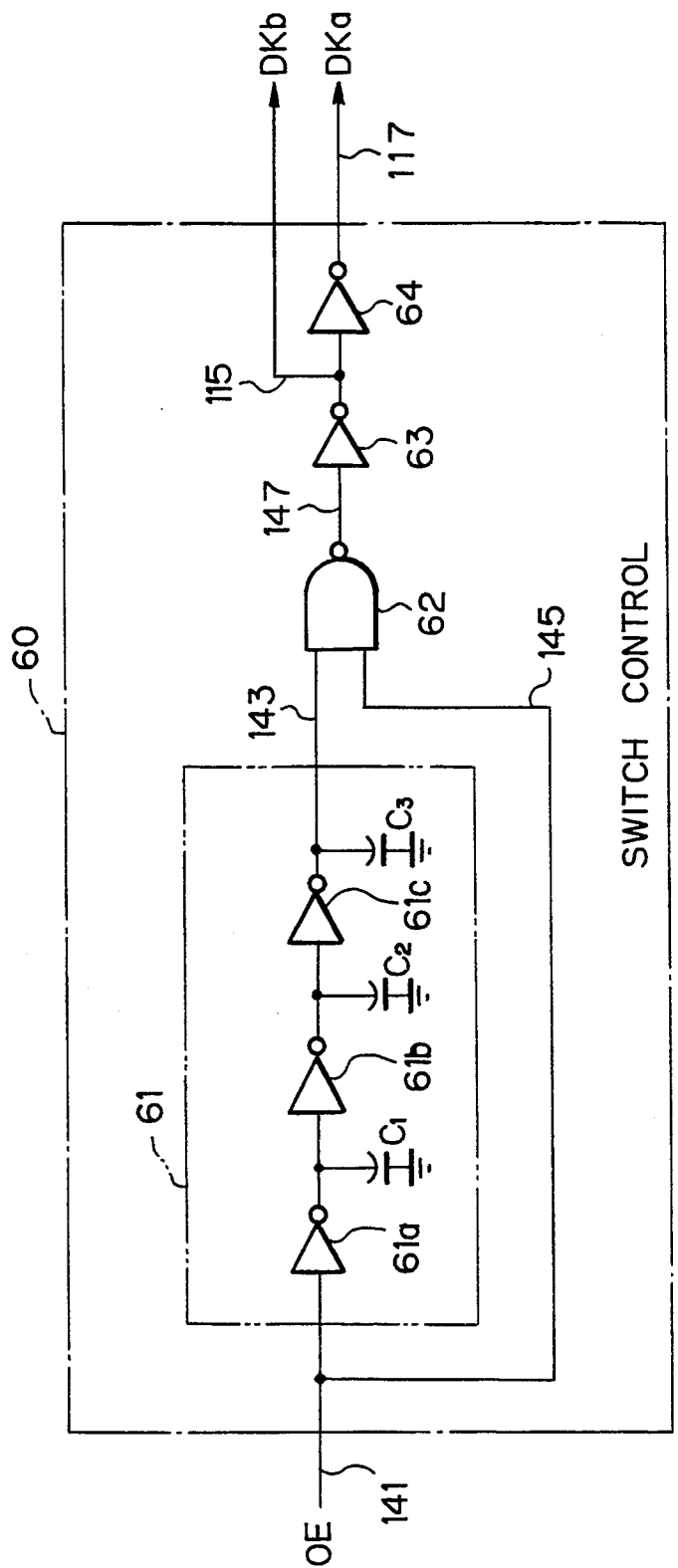
FIG. 2 shows a specific construction of a circuit for generating a control signal which switches a switch circuit included in the embodiment of FIG. 1.

FIG. 2 shows a specific construction of the switch control 60 which generates the switch signals DKa and DKb for driving the switch transistors 41 and 42, as stated above. As shown, the switch control 60 includes a delay circuit 61 which receives the output enable signal OE at an input 141 thereof, delays the signal OE a predetermined period of time, and then produces the delayed signal OE on an output 143. In the specific construction, the delay circuit 61 is made up of three cascaded inverters 61a, 61b and 61c, and parasitic capacitances C1, C2 and C3 associated with the inverters 61a, 61b and 61c, respectively. The output of the third inverter 61c constitutes the output 143 of the delay circuit 61 which is connected to one input of a bi-input NAND gate 62. The other input 145 of the NAND gate 62 is connected to the input 141 of the switch control 60 while the output 147 of the NAND gate 62 is connected to the input of an inverter 63. The NAND gate 62, therefore, produces NAND of the output of the delay circuit 61 and the input OE to the switch control 60. The inverter 63 inverts the logical state of the input 147 and produces the result of inversion on an output 115 thereof as the switch signal DKb. The output 115 of the inverter 63 is also connected to the input of a similar inverter 64. The inverter 64 inverts the logical state of the input 115 and produces the result of inversion on an output 117 thereof as the other switch signal DKa. As FIG. 2 indicates, the switch signals DKa and DKb are complementary to each other. Of course, the switch control 60 shown in FIG. 2 is only illustrative and may have any other suitable configuration.

Figure 4:
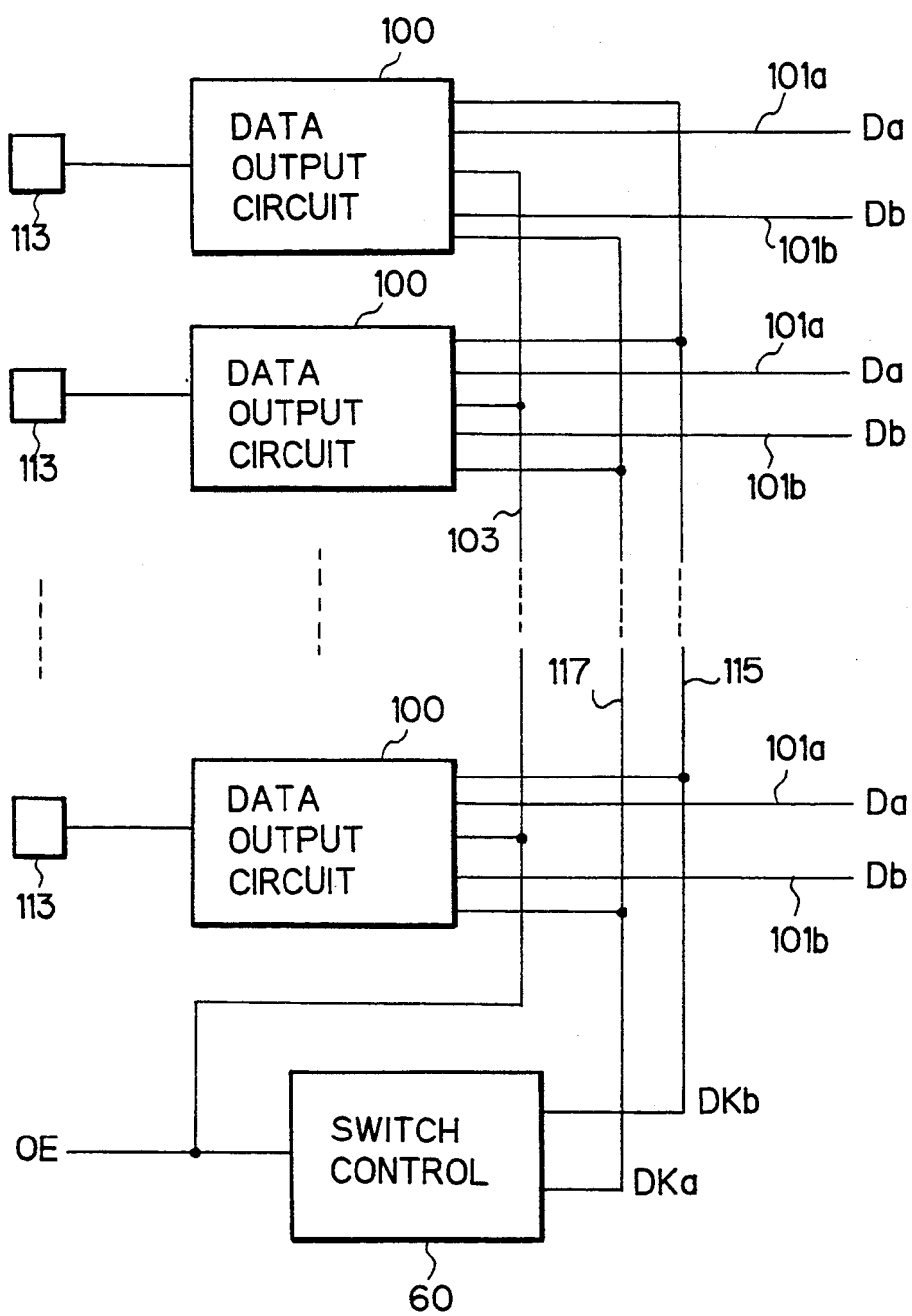
FIG. 4 is a functional block diagram schematically showing an integrated circuit on which a plurality of data output circuits each having the configuration of FIG. 1 are mounted.

As shown in FIG. 4, a plurality of, say, eight data output circuits 100 each having the above construction are mounted on a single semiconductor memory or similar integrated circuit together with other circuit elements. A single switch control 60 is mounted on the IC and shared by the data output circuits 100.

Figure 3:
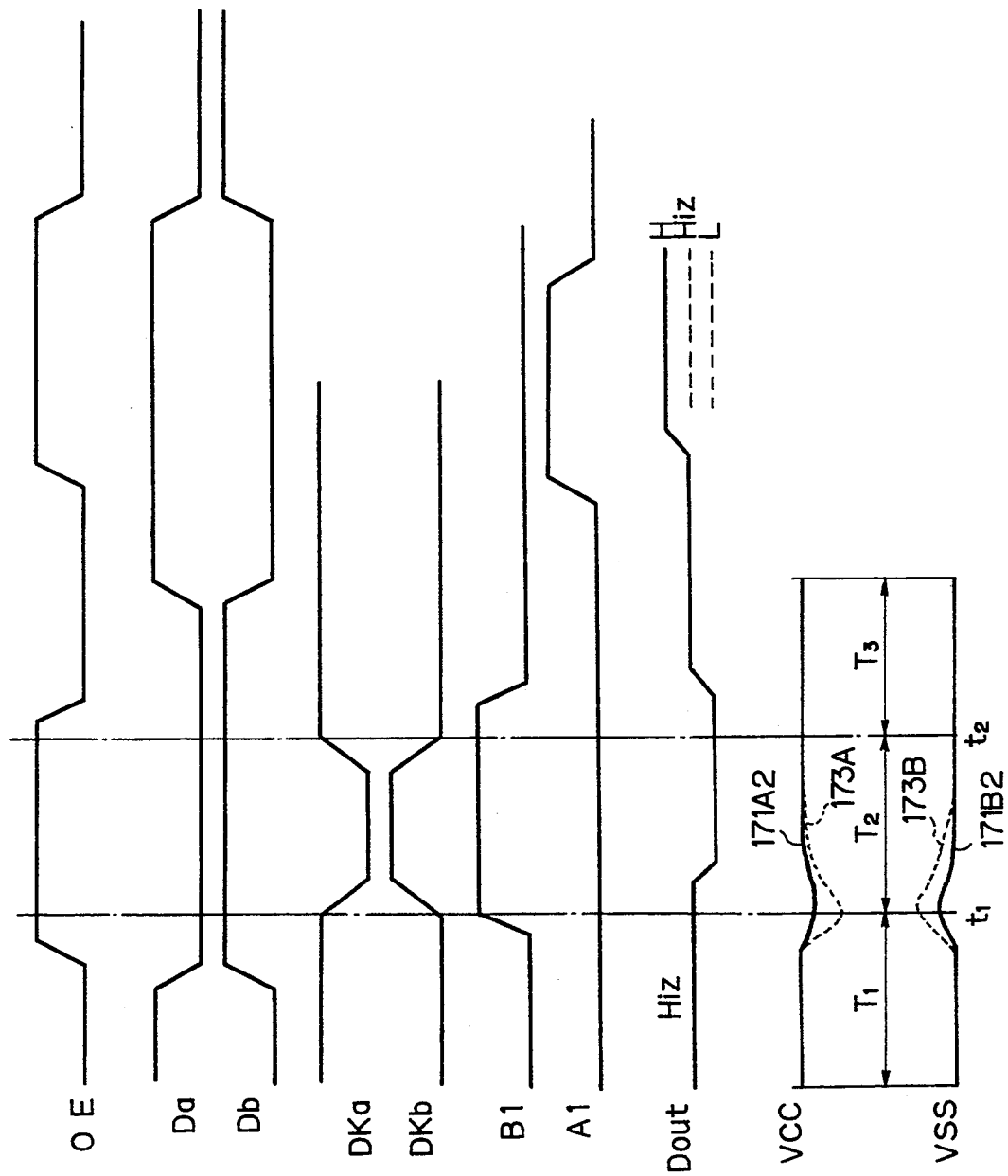
FIG. 3 shows the waveforms of signals appearing in various sections of the circuits shown in FIGS. 1 and 2.

The operation of the data output circuit 100 will be described with reference to FIG. 3. As shown, the operation involves three consecutive periods T1, T2 and T3 which are divided by times $t_1$ and $t_2$ and associated with the transition of the logical states of the complementary switch signals DKa and DKb. During the period T1, the transistors 42 and 41 respectively charge the capacitors 52 and 51 in response to the switch signals DKa and DKb applied thereto. During the period T2, the transistors 42 and 41 respectively cause the capacitors 52 and 51 to discharge in response to the switch signals DKa and DKb. Further, during the period T3, a charge flows from the output transistor 32 or 31 to the ground potential VSS or from the power source potential VCC to the output transistor 32 or 31.

Before outputting data, the control circuit, not shown, maintains the output enable signal OE in a low level. In this condition, the output transistors 31 and 32 remain nonconductive. The output terminal 113, therefore, has a high impedance state Hiz shown in FIG. 3. At the same time, the control circuit changes the switch signals DKa and DKb to a high level and a low level, respectively. The switch signal DKB in a low level turns on the switching transistor 41 with the result that a charge is accumulated in the capacitor 51 from the power source VCC via the transistor 41. The switch signal DKa in a high level turns on the switch transistor 42 to thereby discharge the charge of the capacitor 52 to ground VSS via the transistor 42.

Assume that the data output circuit 100 is to produce data of logical high level on the output terminal 113. Then, after a sufficient charge has been accumulated in the previously mentioned capacitor 51, the control circuit, not shown, changes the 1-bit complementary data Da and Db to a low level and a high level, respectively. At the same time, the control circuit changes the output enable signal OE to a high level. As a result, the outputs 107a and 107b of the latch circuit 10 are latched in a low level and a high level, respectively. The low-level latch output 107a is inverted by the inverter 21 to thereby enable the gate A1 of the output transistor A1. Likewise, the high-level latch output 107b is inverted by the inverter 22 to thereby disable the gate B1 of the output transistor 32.

The output enable signal OE in a high level is also applied to the switch control 60. After the signal OE has been delayed by a predetermined period of time by the delay circuit 61, it changes the switch signals DKa and DKb to, respectively, a low level and a high level at the time $t_1$. The high level switch signal DKb turns off the switch transistor 41 to thereby interrupt the application of the power source VCC to the output transistor 31. As a result, the charge having been stored in the capacitor 51 is applied to the output terminal via the output transistor 31. The low-level switch signal DKa turns off the other switch transistor 42.

Subsequently, at the time $t_2$, the control circuit, not shown, changes the switch signals DKa and DKb to a high level and a low level, respectively. The low-level switch signal DKb again renders the switch transistor 41 conductive. As a result, a charge is fed from the power source VCC to the output terminal 113 via the switch transistor 41 and output transistor 31. The switch transistor 42 is again turned on by the low-level switch signal DKb.

It is noteworthy that the flow of the charge from the capacitor 51 to the output terminal 113 around the time $t_1$ eliminates a sharp fall of potential which would otherwise occur on the node A2 between the output transistor 31 and the capacitor 51. In FIG. 3, a solid curve 171A2 is representative of a change in the potential on the node A2. A conventional data output circuit lacks the capacitor 51, switch transistor 41 and circuitry associated therewith and, therefore, suffers from a sharp change in potential at a position corresponding to the node A2, as indicated by a dotted curve 173A in FIG. 3. In this manner, the embodiment minimizes the noise at the power source VCC. On the other hand, the potential on the node B2 between the output transistor 32 and the capacitor 52 changes as represented by a solid curve 171B2 in FIG. 3. The conventional data output circuit lacking the capacitor 52, switch transistor 42 and circuitry associated therewith would cause the potential at a position corresponding to the node B2 to change as indicated by a dotted curve 173B.

On the other hand, to produce data of logical low level on the output terminal 113, after the capacitor 52 has sufficiently discharged to ground VSS via the switch transistor 42, the control circuit, not shown, changes the 1-bit complementary data Da and Db to, respectively, a high level and a low level which are opposite to the logical levels in the previous case. At the same time, the control circuit changes the output enable signal OE to a high level. Then, the outputs 107a and 107b of the latch 10 are latched in a high level and a low level, respectively. The low-level latch output 107b is inverted by the inverter 22 to render the output transistor 32 conductive while the high-level latch output 107a is inverted by the inverter 21 to render the output transistor 31 nonconductive.

On the elapse of the delay time determined by the delay circuit 61, i.e., at the time $t_1$, the switch signals DKa and DKb go low and go high, respectively, in response to the output enable signal OE which is in a high level. Then, the switch signal DKa turns off the switch transistor 42 with the result that the flow of charge from the output terminal 113 to ground VSS via the switch transistor 31 is interrupted. As a result, the charge from the output terminal 113 is conducted to the capacitor 52 via the output transistor 32, charging the capacitor 52.

Subsequently, at the time $t_2$, the control circuit, not shown, changes the switch signals DKa and DKb to a high level and a low level, respectively. Then, the low level switch signal DKb again turns on the switch transistor 42 with the result that the charge from the output terminal 113 is routed through the output transistor 32 and switch transistor 42 to ground VSS.

As the switch transistor 42 is turned off at the time $t_1$, the charge having flown from the output terminal 113 to ground VSS via the transistors 32 and 42 is switched to the capacitor 52 and, therefore, temporarily accumulated in the capacitor 52. Thereafter, at the time $t_2$ when the switch transistor 42 is turned on, the charge stored in the capacitor 52 is discharged to ground VSS. With such temporary storage of a charge in the capacitor 52, it is possible to eliminate a sharp change in potential which would otherwise occur on the node B2 between the output transistor 32 and the capacitor 52. This is successful in lowering the peak of power source noise.

In summary, in the illustrative embodiment, the charge from the power source VCC is accumulated in the capacitors 51 and 52 prior to the output of data. When data should be outputted, the charge stored in the capacitor 51 is applied to the output terminal. This successfully reduces noise particular to the power source VCC. At the time of outputting data, the charge stored in the capacitor 52 is discharged to ground VSS, reducing noise particular to the power source VSS.

As stated above, the embodiment compensates for instantaneous changes in the two reference potentials VCC and VSS by using the charge and discharge of the capacitors 51 and 52. As a result, noise to be induced in the power sources is minimized. An integrated circuit, FIG. 4, having a number of such data output circuits 100 matching the output bit positions suffers from a minimum of malfunctions and has a high access rate.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. An integrated circuit comprising a plurality of data output circuits, each of which is responsive to data signals complementary to each other for outputting data corresponding to said data signals:

each of said plurality of data output circuits comprising:

an output terminal for outputting the data;

a first output transistor comprising a path of controllable conductivity whose one electrode is connected to said output terminal, and a control electrode for controlling said path of controllable conductivity in response to a first signal;

a second output transistor comprising a path of controllable conductivity whose one electrode for controlling said path of controllable conductivity in response to a second signal complementary to the first signal;

a first switch transistor comprising a path of controllable conductivity having one electrode connected to the other electrode of the path of controllable conductivity of said first output transistor and another electrode connected to a first power source, and a control electrode for rendering said path of controllable conductivity of said first switch transistor conductive in response to a first switch signal; and a first capacitor having one electrode connected to another electrode of the path of controllable conductivity of said first output transistor and another electrode connected to a second power source;

said integrated circuit further comprising a control circuit for receiving a control signal which occurs after the first signal, delaying said control signal a predetermined period of time to produce the first switch signal, and feeding said first switch signal to said first switch transistor of each of said plurality of data output circuits.

2. An integrated circuit in accordance with claim 1, wherein each of said plurality of data output circuits further comprises:

a second switch transistor having a path of controllable conductivity connected at one electrode to another electrode of the path of controllable conductivity of said second output transistor and at another electrode to said second power source, and a control electrode for rendering said path of controllable conductivity conductive in response to a second switch signal; and a second capacitor having one electrode connected to the other electrode of the path of controllable conductivity of said second output transistor and another electrode connected to said first power source;

said control circuit delaying the control signal the predetermined period f time to produce the second switch signal complementary to the first switch signal and feeding said second switch signal to said second switch transistor of each of said plurality of data output circuits.

3. An integrated circuit in accordance with claim 1, wherein each of said plurality of data output circuits further comprises a latch circuit for receiving the data signals, holding said data signals in response to the control signal, and applying the first and second signals respectively to said control electrodes of said first and second output transistors in response to said data signals.

4. A data output circuit comprising:

an output terminal for outputting data;

a first output transistor having a first electrode, a second electrode connected to said output terminal and a first control electrode for receiving a first control signal, the first control signal being in a first logic level in a first period and said first output transistor being in a conductive state when the first control electrode receives the first control signal in the first logic level;

a second output transistor having a third electrode connected to said output terminal, a fourth electrode for receiving a voltage of a second level thereto and second control electrode for receiving a second control signal, the second control signal being in the first logic level in a second period different from the first period and said second output transistor being in its conductive state when the second control electrode receives the second control signal in the first logic level;

a first switch transistor having a fifth electrode connected to said first electrode, a sixth electrode for receiving a voltage of a first level thereto and a third control electrode for receiving a first switch signal, the first switch signal being in a second logic level in a third and a fourth period, the third period corresponding to a preceding portion of the first period and the fourth period corresponding to a preceding portion of the second period and said first switch transistor being in a non-conductive state only when said third control electrode receives the first switch signal in the second logic level; and a first capacitor having a seventh electrode for applying the voltage of the second level and an eighth electrode connected to said first electrode.

5. A data output circuit in accordance with claim 4, further comprising:

a second switch transistor having a ninth electrode connected to said fourth electrode, a tenth electrode for receiving the voltage of the second level thereto and a fourth control electrode for receiving a second switch signal, the second switch signal being in the first logic level in the third and fourth period and said second switch transistor being in the non-conductive state only when said fourth control electrode receives the second switch signal in the first logic level;

a second capacitor having an eleventh electrode for applying the voltage of the second level and twelfth electrode connected to said fourth electrode.

6. A data output circuit in accordance with claim 5, further comprising a latch circuit for receiving data signals complementary to each other, holding the data signals in response to a third control signal, and applying the first and second control signals to, respectively, said first and second control electrodes in association with the data signals.

7. A data output circuit in accordance with claim 5, further comprising a control circuit responsive to the third control signal for delaying said third control signal a predetermined period of time to thereby produce the first and second switch signals.

8. A data output circuit in accordance with claim 4, wherein the third period simultaneously begins when the first period begins and ends before the first period ends.

9. A data output circuit in accordance with claim 4, wherein the fourth period simultaneously begins when the second period begins and ends before the second period ends.

10. A data output circuit comprising:

an output terminal for outputting data;

a first voltage level circuit outputting a voltage of a first level to said output terminal in a following portion of a first period;

said first voltage level circuit comprising:

a first output transistor having an output electrode connected to said output terminal;

a first switch transistor having an output electrode connected to an input electrode of said first output transistor and to a second power source through a capacitor, and an input electrode connected to a first power source;

a second voltage level circuit outputting a voltage of a second level to said output terminal in complement to said first voltage level circuit in a preceding portion of said first period;

said second voltage level circuit comprising:

a second output transistor having an output electrode connected to said output terminal;

a second switch transistor having an output electrode connected to an input electrode of said second output transistor and to the first power source through a capacitor, and an input electrode connected to the second power source;

a latch circuit including a pair of tri-input NAND gates having complementary output gates respectively connected to control electrodes of said first and second output transistors through an inverter for respectively controlling both said output transistors, input gates commonly connected so as to output an output enable signal and other input gates being for respectively receiving complementary data;

a switch control circuit having a pair of output electrodes respectively connected to switch control electrodes of said first and second switch transistors; and said switch control circuit receiving the output enable signal from said latch circuit and complementarily switching said switch transistors.

11. A data output circuit in accordance with claim 10, wherein said output transistor outputs the voltage of the second level in the preceding portion of said first period.

* * * * *